(12) United States Patent
Choi et al.

(10) Patent No.: US 10,515,579 B2
(45) Date of Patent: Dec. 24, 2019

(54) DISPLAY DEVICE

(71) Applicant: Samsung Display Co., Ltd., Yongin-si, Gyeonggi-do (KR)

(72) Inventors: Chaungi Choi, Suwon-si (KR); Jihun Ryu, Hwaseong-si (KR); Taekyung Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/946,603

(22) Filed: Apr. 5, 2018

(65) Prior Publication Data

US 2018/0293933 A1 Oct. 11, 2018

(51) Int. Cl.
*G09G 3/296* (2013.01)
*H01L 51/52* (2006.01)
*H01L 27/32* (2006.01)
*H01L 35/32* (2006.01)
*G09G 3/3225* (2016.01)
*H01L 35/34* (2006.01)

(52) U.S. Cl.
CPC ........... *G09G 3/296* (2013.01); *G09G 3/3225* (2013.01); *H01L 27/3225* (2013.01); *H01L 35/32* (2013.01); *H01L 35/34* (2013.01); *H01L 51/5203* (2013.01); *H01L 51/524* (2013.01); *G09G 2310/0264* (2013.01); *G09G 2330/045* (2013.01)

(58) Field of Classification Search
CPC ................. G09G 3/296; G09G 3/3225; G09G 2330/045; G09G 2310/0264
See application file for complete search history.

(56) References Cited

U.S. PATENT DOCUMENTS

| 4,859,250 A  * | 8/1989  | Buist ....................... F25B 21/02 136/225 |
| 2013/0120290 A1 * | 5/2013  | Yumiki .................... G06F 3/041 345/173 |
| 2014/0014154 A1 * | 1/2014  | Hayashi .................. H01L 35/32 136/205 |
| 2014/0132896 A1 * | 5/2014  | Choi ...................... G02F 1/13363 349/96 |
| 2016/0329478 A1 | 11/2016 | Jin et al. |
| 2017/0249916 A1 * | 8/2017  | Jen ........................ G09G 3/3677 |

FOREIGN PATENT DOCUMENTS

| KR | 10-1564629 B1 | 10/2015 |
| KR | 10-1628008 B1 | 6/2016 |
| KR | 10-2016-0090196 A | 7/2016 |

* cited by examiner

*Primary Examiner* — Md Saiful A Siddiqui
(74) *Attorney, Agent, or Firm* — Lewis Roca Rothgerber Christie LLP

(57) ABSTRACT

A display device includes: a substrate including at least two layers; a driving circuit on the substrate; a pixel electrode connected to the driving circuit; a common electrode on the pixel electrode; a display layer between the pixel electrode and the common electrode; and a thermoelectric element located between the at least two layers of the substrate.

20 Claims, 10 Drawing Sheets

DISPLAY DEVICE

CROSS-REFERENCE TO RELATED APPLICATION

This application claims priority to and the benefit of Korean Patent Application No. 10-2017-0045905, filed on Apr. 10, 2017, in the Korean Intellectual Property Office (KIPO), the disclosure of which is incorporated by reference herein in its entirety.

BACKGROUND

1. Field

Some example embodiments of the present invention relate to a display device.

2. Discussion of Related Art

Flat panel display (FPD) devices have a characteristic of relatively reduced weight and volume, compared to a cathode ray tube (CRT). Such FPD devices may include liquid crystal display (LCD) devices, field emission display (FED) devices, plasma display panel (PDP), devices, and organic light emitting diode (OLED) display devices, for example.

Among the FPD devices, the OLED display device displays images using OLEDs that generate light by recombination of electrons and holes.

The above information disclosed in this Background section is only for enhancement of understanding of the background and therefore it may contain information that does not constitute prior art.

SUMMARY

Some example embodiments of the present invention relate to a display device. For example some embodiments may include a display device capable of relatively easily releasing internal heat efficiently to the outside.

According to some example embodiments of the present invention, a display device includes: a substrate comprising at least two layers; a driving circuit on the substrate; a pixel electrode connected to the driving circuit; a common electrode on the pixel electrode; a display layer between the pixel electrode and the common electrode; and a thermoelectric element between the at least two layers of the substrate.

According to some embodiments, the at least two layers comprise a first base layer and a second base layer facing each other with the thermoelectric element interposed therebetween.

According to some embodiments, the at least two layers further comprise a first protective layer between the first base layer and the thermoelectric element.

According to some embodiments, the at least two layers further comprise a second protective layer between the second base layer and the driving circuit.

According to some embodiments, the thermoelectric element comprises a Peltier element.

According to some embodiments, the thermoelectric element includes: a lower electrode between the two layers and contacting one of the two layers; an upper electrode between the two layers and contacting the other of the two layers; and a P-type thermoelectric semiconductor element and an N-type thermoelectric semiconductor element between the lower electrode and the upper electrode.

According to some embodiments, the lower electrode comprises a plurality of lower electrodes separated from each other.

According to some embodiments, the display device further includes a direct current (DC) power source connected to one of the plurality of lower electrodes and another of the plurality of lower electrodes.

According to some embodiments, a first terminal of the direct current (DC) power source is directly connected to one of the lower electrodes, and a second terminal of the direct current (DC) power source is directly connected to another of the lower electrodes.

According to some embodiments, a first terminal of the direct current (DC) power source is connected to one of the lower electrodes through a first contact hole passing through the driving circuit and the substrate, and a second terminal of the direct current (DC) power source is connected to another of the lower electrodes through a second contact hole passing through the driving circuit and the substrate.

According to some embodiments, the display layer includes a light emitting element or a liquid crystal.

According to some embodiments, the display device further includes a sealing member or an opposing substrate on the common electrode.

According to some example embodiments of the present invention, a display device includes: a substrate; a driving circuit on the substrate; a pixel electrode connected to the driving circuit; a common electrode on the pixel electrode; a display layer between the pixel electrode and the common electrode; and a thermoelectric element facing the driving circuit with the substrate interposed therebetween.

According to some embodiments, the display device further includes an adhesive layer between the substrate and the thermoelectric element.

According to some embodiments, the adhesive layer comprises a pressure sensitive adhesive (PSA) or an optical clean adhesive (OCA).

According to some embodiments, the substrate comprises at least two layers.

According to some embodiments, the at least two layers include: a first base layer; and a second base layer on the first base layer.

According to some embodiments, the at least two layers further comprise a first protective layer between the first base layer and the second base layer.

According to some embodiments, the at least two layers further comprise a second protective layer between the second base layer and the driving circuit.

According to some embodiments, the thermoelectric element comprises a Peltier element.

According to some embodiments, the thermoelectric element includes: a lower base layer; an upper base layer between the lower base layer and the substrate; a lower electrode between the lower base layer and the upper base layer and contacting the lower base layer; an upper electrode between the lower base layer and the upper base layer and contacting the upper base layer; and a P-type thermoelectric semiconductor element and an N-type thermoelectric semiconductor element between the lower electrode and the upper electrode.

The foregoing is illustrative only, and is not intended to be in any way limiting. In addition to the illustrative aspects, example embodiments, and features described above, further aspects, example embodiments, and features will become more apparent by reference to the drawings, and the following detailed description.

BRIEF DESCRIPTION OF THE DRAWINGS

A more complete appreciation of aspects of the present invention will become more apparent by describing in more detail aspects of example embodiments thereof with reference to the accompanying drawings, wherein.

DETAILED DESCRIPTION

Figure 1:
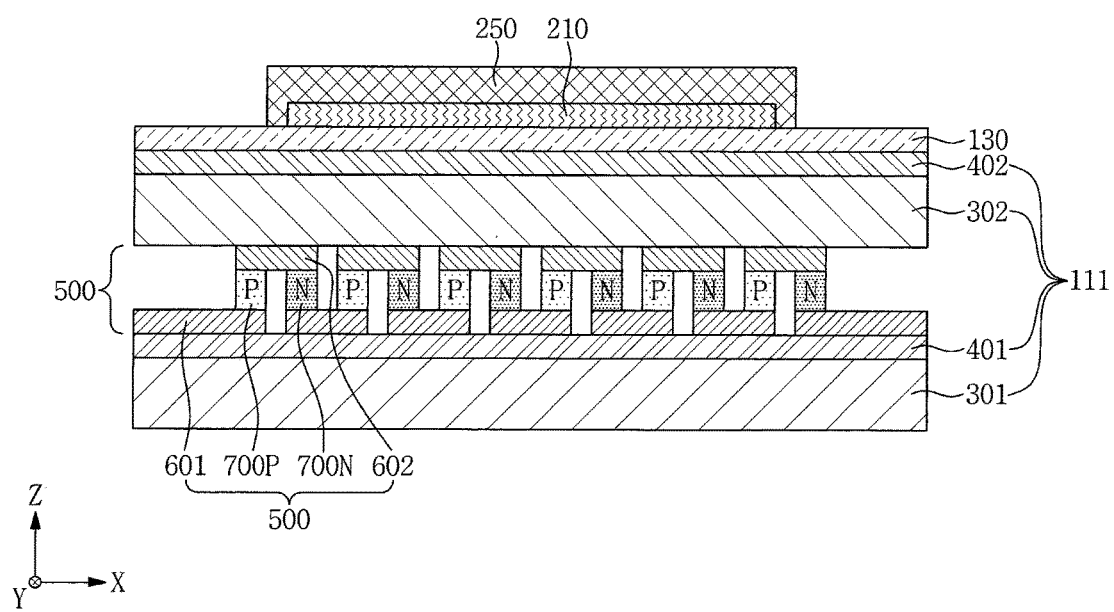
FIG. 1 is a cross-sectional view illustrating a display device according to some example embodiments.

Aspects of some example embodiments will now be described more fully hereinafter with reference to the accompanying drawings. Although the invention may be modified in various manners and have several example embodiments, example embodiments are illustrated in the accompanying drawings and will be mainly described in the specification. However, the scope of the invention is not limited to the example embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention and like reference numerals refer to like elements throughout the specification.

Hereinafter, aspects of a display device according to some example embodiments will be described in more detail with reference to FIGS. 1 to 10.

Figure 2:
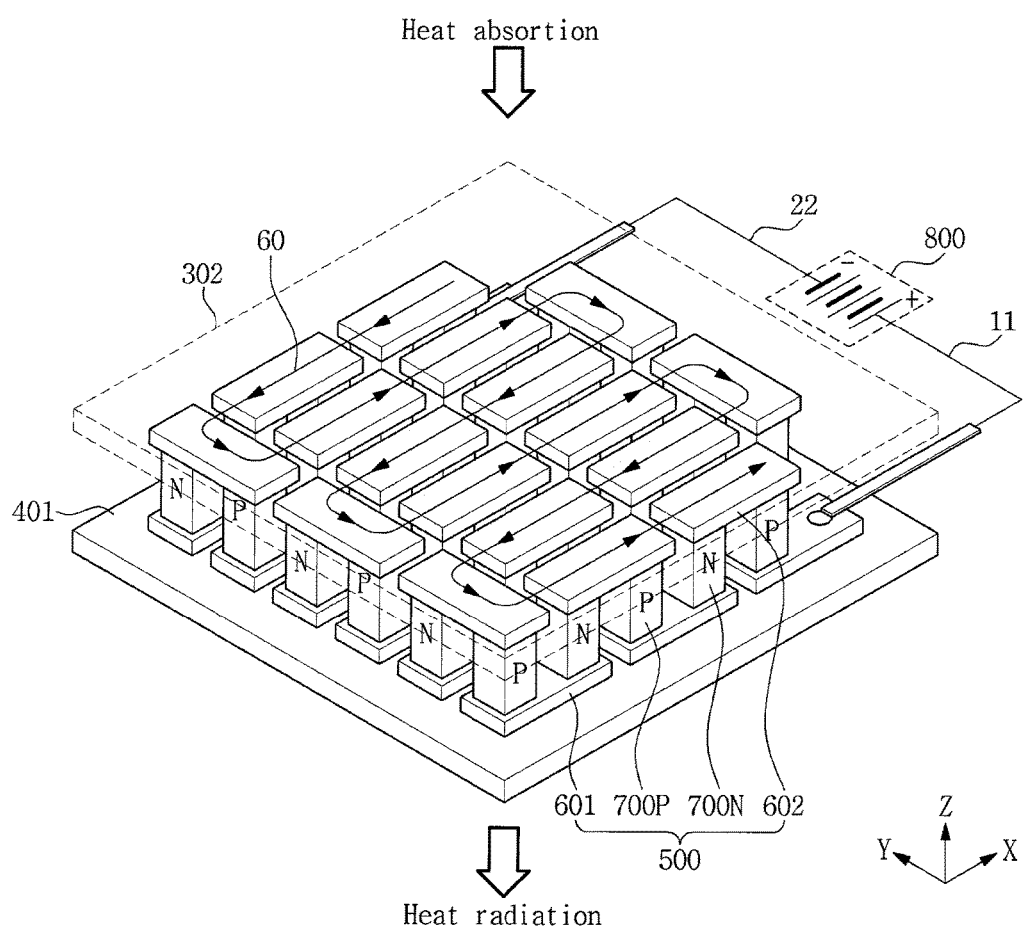
FIG. 2 is a perspective view illustrating a thermoelectric element of FIG. 1.

FIG. 1 is a cross-sectional view illustrating a display device according to some example embodiments, and FIG. 2 is a perspective view illustrating a thermoelectric element of FIG. 1.

As illustrated in FIG. 1, a display device according to some example embodiments includes a substrate 111, a thermoelectric element 500, a driving circuit portion (or driving circuit) 130, a display portion (or display) 210, and a sealing member (or sealant or encapsulant) 250.

The driving circuit portion 130 is located on the substrate 111. The driving circuit portion 130 may include at least one switching element. The driving circuit portion 130 drives the display portion 210.

The display portion 210 is located on the driving circuit portion 130. The display portion 210 may include a pixel electrode, a display layer, and a common electrode. The display layer is located between the pixel electrode and the common electrode.

The sealing member 250 is located on the display portion 210. In some example embodiments, the sealing member 250 surrounds and/or covers/encapsulates the display portion 210.

The substrate 111 includes at least two layers arranged along a direction parallel to a Z axis (hereinafter, "a Z-axis direction"). For example, the at least two layers may include a first base layer 301, a first protective layer 401, a second base layer 302, and a second protective layer 402. The first base layer 301, the first protective layer 401, the second base layer 302, and the second protective layer 402 are arranged along the Z-axis direction. In such an example embodiment, at least one of the first protective layer 401 and the second protective layer 402 may be removed.

The first protective layer 401 is located on the first base layer 301, the second base layer 302 is located on the first protective layer 401, and the second protective layer 402 is located on the second base layer 302. In other words, the first protective layer 401 is located between the first base layer 301 and the second base layer 302, and the second base layer 302 is located between the first protective layer 401 and the second protective layer 402.

The thermoelectric element 500 may be located between two layers included in the substrate 111 described above. For example, the thermoelectric element 500 may be located between the first base layer 301 and the second base layer 302. As a more specific example, as illustrated in FIG. 1, the thermoelectric element 500 may be located between the first protective layer 401 and the second base layer 302. The thermoelectric element 500 may include a Peltier element.

The thermoelectric element 500 includes a lower electrode 601, an upper electrode 602, a P-type thermoelectric semiconductor element 700P, and an N-type thermoelectric semiconductor element 700N, as illustrated in FIGS. 1 and 2.

The lower electrode 601 and the upper electrode 602 are located between the first protective layer 401 and the second base layer 302. According to some example embodiments, the lower electrode 601 is located closer to the first protective layer 401 of the first protective layer 401 and the second base layer 302, and the upper electrode 602 is located closer to the second base layer 302 of the first protective layer 401 and the second base layer 302. The lower electrode 601 of the lower electrode 601 and the upper electrode 602 is located closer to the first protective layer 401, and the upper electrode 602 of the lower electrode 601 and the upper electrode 602 is located closer to the second base layer 302.

The lower electrode 601 may contact the first protective layer 401. If there is no first protective layer 401, the lower electrode 601 may contact the first base layer 301.

The upper electrode 602 may contact the second base layer 302. If there is no second base layer 302, the upper electrode 602 may contact the second protective layer 402.

The lower electrode 601 may include a plurality of lower electrodes 601 separated from each other. In other words, the thermoelectric element 500 according to some example embodiments may include the plurality of lower electrodes 601 separated from each other. As illustrated in FIG. 1, the plurality of lower electrodes 601 are arranged along a direction parallel to an X axis (hereinafter, "an x-axis direction"). In addition, as illustrated in FIG. 2, the plurality of lower electrodes 601 are arranged along a direction parallel to a Y axis (hereinafter, "a Y-axis direction"). In other words, the plurality of lower electrodes 601 are located along a planar surface defined by the X axis and the Y axis (hereinafter, an X-Y planar surface).

The upper electrode 602 may include a plurality of upper electrodes 602 separated from each other. In other words, the thermoelectric element 500 according to some example embodiments may include a plurality of upper electrodes 602 separated from each other. As illustrated in FIG. 1, the plurality of upper electrodes 602 are spaced apart from the lower electrodes 601 in the Z-axis direction by a distance (e.g., a predetermined distance), and are arranged along the X-axis direction. In addition, as illustrated in FIG. 2, the plurality of upper electrodes 602 are spaced apart from the lower electrodes 601 in the Z-axis direction by a distance (e.g., a predetermined distance), and are arranged along the Y-axis direction. In other words, the plurality of upper electrodes 602 are spaced apart from the lower electrodes 601 in the Z-axis direction by a distance (e.g., a predetermined distance), and are located along the X-Y planar surface.

The upper electrode 602 may overlap two adjacent ones of the lower electrodes 601. For example, as illustrated in FIG. 1, one upper electrode 602 (hereinafter, "an outermost upper electrode") located at a leftmost portion overlaps two lower electrodes 601 that are located below the one upper electrode 602 and are adjacent to each other. For example, when a left one of the two lower electrodes 601 is defined as a first lower electrode and a right one of the two lower electrodes 601 adjacent to the first lower electrode is defined as a second lower electrode, one side edge of the outermost upper electrode and one side edge of the first lower electrode overlap each other, and another side edge of the outermost upper electrode and one side edge of the second lower electrode overlap each other.

According to some example embodiments, when a portion of the upper electrode 602 (e.g., the aforementioned outermost upper electrode) between one side edge and another side edge thereof is defined as a central portion of the upper electrode 602, the central portion of the upper electrode 602 faces the first protective layer 401. In addition, when a portion of the lower electrode 601 (e.g., the aforementioned second lower electrode) between one side edge and another side edge thereof is defined as a central portion of the lower electrode 601, the central portion of the lower electrode 601 faces the second base layer 302.

The P-type thermoelectric semiconductor element 700P is located between the lower electrode 601 and the upper electrode 602. One side end portion of the P-type thermoelectric semiconductor element 700P is connected to the lower electrode 601, and another side end portion of the P-type thermoelectric semiconductor element 700P is connected to the upper electrode 602.

The N-type thermoelectric semiconductor element 700N is located between the lower electrode 601 and the upper electrode 602. One side end portion of the N-type thermoelectric semiconductor element 700N is connected to the lower electrode 601, and another side end portion of the N-type thermoelectric semiconductor element 700N is connected to the upper electrode 602.

The P-type thermoelectric semiconductor element 700P and the N-type thermoelectric semiconductor element 700N are alternately arranged. For example, odd-numbered thermoelectric semiconductor elements of the thermoelectric semiconductor elements arranged in a line along the X-axis direction may be P-type thermoelectric semiconductor elements 700P, and even-numbered thermoelectric semiconductor elements of the thermoelectric semiconductor elements arranged in a line along the X-axis direction may be N-type thermoelectric semiconductor elements 700N.

The P-type thermoelectric semiconductor element 700P and the N-type thermoelectric semiconductor element 700N that are adjacent to each other are connected in common to one of the upper electrode 602 and the lower electrode 601, and are individually connected to the other of the upper electrode 602 and the lower electrode 601.

For example, in FIG. 1, when a P-type thermoelectric semiconductor element 700P located at a leftmost portion is defined as a first thermoelectric semiconductor element, and an N-type thermoelectric semiconductor element 700N adjacent to the first thermoelectric semiconductor element is defined as a second thermoelectric semiconductor element, another side end portion of the first thermoelectric semiconductor element and another side end portion of the second thermoelectric semiconductor element are connected in common to one upper electrode 602. Additionally, one side end portion of the first thermoelectric semiconductor element is connected to a left lower electrode 601 (the aforementioned first lower electrode) of two lower electrodes 601 adjacent to each other, and one side end portion of the second thermoelectric semiconductor element is connected to a right lower electrode 601 (the aforementioned second lower electrode) of the two lower electrodes 601 adjacent to each other.

The P-type thermoelectric semiconductor element 700P, the N-type thermoelectric semiconductor element 700N, and three electrodes (two lower electrodes 601 and one upper electrode 602 or two upper electrodes 602 and one lower electrode 601) connected to the P-type thermoelectric semiconductor element 700P and the N-type thermoelectric semiconductor element 700N form a pi ($\pi$) shape.

In some example embodiments, the thermoelectric element 500 further includes a lower base layer and an upper base layer. In the structure illustrated in FIG. 1, the first protective layer 401 may serve as a lower base layer of the thermoelectric element 500, and the second base layer 302 may serve as an upper base layer of the thermoelectric element 500.

As illustrated in FIG. 2, the P-type thermoelectric semiconductor elements 700P and the N-type thermoelectric semiconductor elements 700N are connected in series between one side terminal of the DC power source 800 and another side terminal of the DC power source 800. That is, the P-type thermoelectric semiconductor elements 700P and the N-type thermoelectric semiconductor elements 700N described above are connected in series between a first terminal 11 and a second terminal 22 of the DC power source 800 through the plurality of lower electrodes 601 and the plurality of upper electrodes 602.

One lower electrode 601 (hereinafter, a third lower electrode) of the lower electrodes 601 may be connected to the first terminal 11 of the DC power source 800, and another lower electrode 601 (hereinafter, a fourth lower electrode) of the lower electrodes 601 may be connected to the second terminal 22 of the DC power source 800. In some example embodiments, the third lower electrode is a lower electrode 601 connected to one of the P-type thermoelectric semiconductor element 700P and the N-type thermoelectric semiconductor element 700N, and the fourth lower electrode is a lower electrode 601 connected to the other of the P-type thermoelectric semiconductor element 700P and the N-type thermoelectric semiconductor element 700N.

For example, as illustrated in FIG. 2, the third lower electrode may be a lower electrode 601 connected to the P-type thermoelectric semiconductor element 700P, and the fourth lower electrode may be a lower electrode 601 connected to the N-type thermoelectric semiconductor element 700N. In some example embodiments, the third lower electrode 601 is connected to a positive terminal of the DC power source 800, and the fourth lower electrode 601 is connected to a negative terminal of the DC power source 800. The positive terminal corresponds to the first terminal 11 of the DC power source 800, and a positive voltage is output from the positive terminal. The negative terminal corresponds to the second terminal 22 of the DC power source 800, and a negative voltage is output from the negative terminal.

An arrow 60 illustrated in FIG. 2 indicates a direction of a current flowing through the upper electrodes 602.

When a voltage based on the DC power source 800 is applied to the thermoelectric element 500, the thermoelectric element 500 absorbs a heat generated from the display portion 210 and emits the heat to the outside. For example, the thermoelectric element 500 absorbs the heat generated from a display layer 212 of the display portion 210 through the driving circuit portion 130, the second protective layer 402, and the second base layer 302, and releases the absorbed heat toward the first protective layer 401. The heat emitted from the thermoelectric element 500 passes through the first protective layer 401 and the first base layer 301 to the outside. That is, the thermoelectric element may efficiently discharge the heat of the display portion 210 to the outside through active heat absorption and radiation operation.

Figure 3:
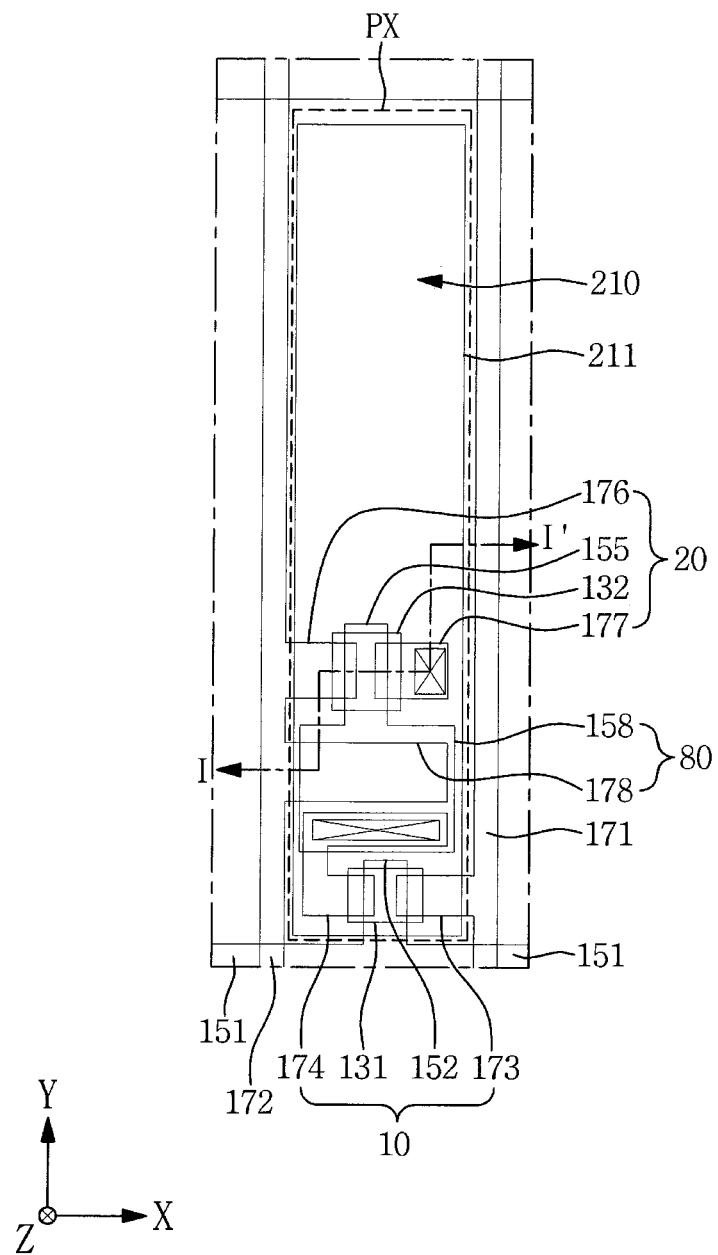
FIG. 3 is a plan view illustrating one pixel included in the display device of FIG. 1.
Figure 4:
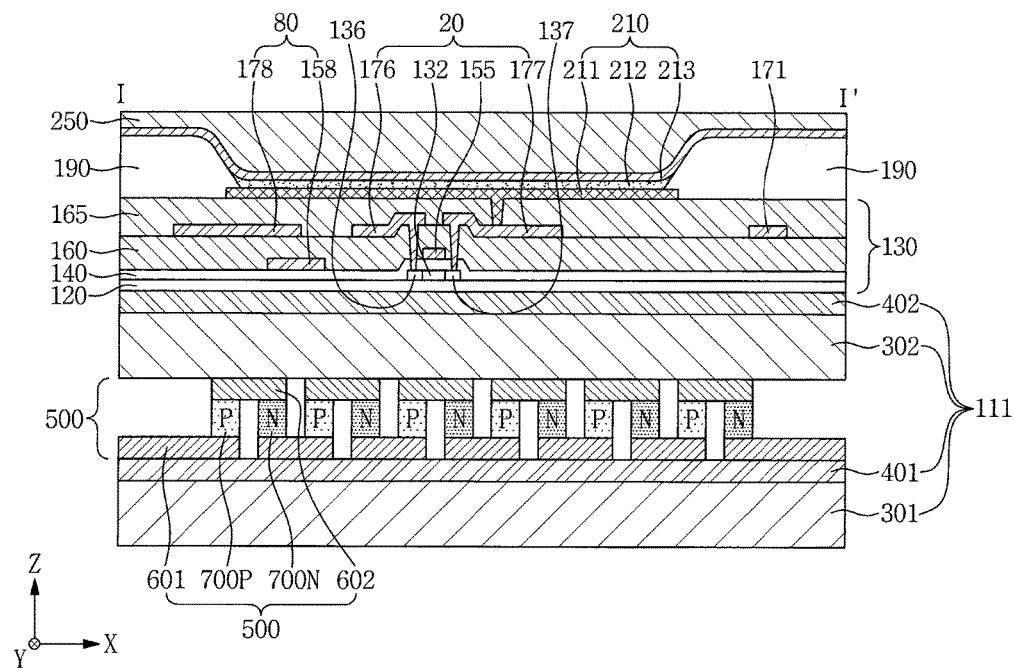
FIG. 4 is a cross-sectional view taken along the line I-I' of FIG. 3.

FIG. 3 is a plan view illustrating one pixel included in the display device of FIG. 1, and FIG. 4 is a cross-sectional view taken along the line I-I' of FIG. 3.

The pixel PX may be located at an area (a pixel area) defined by a gate line 151, a data line 171, and a common power line 172, as illustrated in FIGS. 3 and 4.

The pixel PX refers to a smallest unit for displaying images, and may be any one of a red pixel emitting red light, a green pixel emitting green light, and a blue pixel emitting blue light. The pixel PX includes a display portion 210 and a driving circuit portion 130 for driving the display layer 212 of the display portion 210. The driving circuit portion 130 includes a switching thin film transistor ("TFT") 10, a driving TFT 20, and a capacitor 80.

The display portion 210 may include a pixel electrode 211, the display layer 212, and a common electrode 213. In some example embodiments, the display layer 212 may include an organic light emitting element.

The driving circuit portion 130 is located on the substrate 111. For example, the driving circuit portion 130 is located on the second protective layer 402 of the substrate 111. In other words, the switching TFT 10, the driving TFT 20, and the capacitor 80 are located on the second protective layer 402. The driving circuit portion 130 drives the display layer 212 of the display portion 210.

A more detailed configuration of the driving circuit portion 130 and the light emitting element 210 is illustrated in FIGS. 3 and 4, but example embodiments are not limited to the configuration illustrated in FIGS. 3 and 4. The driving circuit portion 130 and the display portion 210 may be formed into various structures within a range that may easily be conceived and modified by those skilled in the art.

Referring to FIG. 4, one pixel PX includes two TFTs and one capacitor, but example embodiments are not limited thereto. For example, one pixel PX may include a different number of TFTs and/or capacitors in another example embodiment, for example, three or more TFTs and two or more capacitors, and may have various structures including additional signal lines.

The first base layer 301 of the substrate 110 may be a transparent insulating layer including glass and transparent plastic. For example, the first base layer 301 may include at least one selected from the group consisting of: kapton, polyethersulphone (PES), polycarbonate (PC), polyimide (PI), polyethyleneterephthalate (PET), polyethylene naphthalate (PEN), polyacrylate (PAR), fiber reinforced plastic (FRP), and the like.

The first protective layer 401 of the substrate 111 is located on the first base layer 301. The first protective layer 401 may include an inorganic material. The second base layer 302 of the substrate 111 is located on the first protective layer 401. For example, the second base layer 302 is located on the thermoelectric element 500. The second base layer 302 of the substrate 111 may include a material substantially the same as a material included in the first base layer 301 described above.

The second protective layer 402 of the substrate 111 is located on the second base layer 302. The second protective layer 402 may include a material substantially the same as a material included in the first protective layer 401 described above.

A buffer layer 120 is located on the second protective layer 402. The buffer layer 120 serves to substantially prevent permeation of undesirable elements and to planarize a surface therebelow, and may include suitable materials for preventing permeation and/or planarizing. For example, the buffer layer 120 may include one of the followings: a silicon nitride ($SiN_x$) layer, a silicon oxide ($SiO_2$) layer, and a silicon oxynitride ($SiO_xN_y$) layer. However, the buffer layer 120 may be omitted in some embodiments based on the kinds of the substrate 110 and process conditions thereof.

A switching semiconductor layer 131 and a driving semiconductor layer 132 are disposed on the buffer layer 120. The switching semiconductor layer 131 and the driving semiconductor layer 132 may include at least one of the followings: a polycrystalline silicon layer, an amorphous silicon layer, and an oxide semiconductor such as indium gallium zinc oxide (IGZO) and indium zinc tin oxide (IZTO). For example, when the driving semiconductor layer 132 illustrated in FIG. 4 includes a polycrystalline silicon layer, the driving semiconductor layer 132 includes a channel area which is not doped with impurities and p+ doped source and drain areas which are formed on opposite sides of the channel area. In some example embodiments, p-type impurities, such as boron B, may be used as dopant ions, and $B_2H_6$ is typically used. Such impurities may vary depending on the kinds of TFTs.

The driving TFT 20 according to some example embodiments uses a p-channel metal oxide semiconductor (PMOS) TFT including p-type impurities, but example embodiments are not limited thereto. Alternatively, the driving TFT 20 may use an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include at least one of: tetraethylorthosilicate (TEOS), silicon nitride ($SiN_x$), and silicon oxide ($SiO_2$). For example, the gate insulating layer 140 may have a double-layer structure where a $SiN_x$ layer having a thickness of about 40 nm and a TEOS layer having a thickness of about 80 nm are sequentially stacked.

A gate wiring including gate electrodes 152 and 155 is disposed on the gate insulating layer 140. The gate wiring further includes the gate line 151, a first capacitor plate 158, and other wirings. The gate electrodes 152 and 155 are disposed so as to overlap at least a portion of or the entirety of the semiconductor layers 131 and 132, for example, a channel area thereof. The gate electrodes 152 and 155 serve to substantially prevent the channel area from being doped with impurities when a source area 136 and a drain area 137 of the semiconductor layers 131 and 132 are doped with impurities during the process of forming the semiconductor layers 131 and 132.

The gate electrodes 152 and 155 and the first capacitor plate 158 are disposed on a same layer (or a substantially same layer) and include a same metal material (or a substantially same metal material). The gate electrodes 152 and 155 and the first capacitor plate 158 may include at least one of molybdenum (Mo), chromium (Cr), and tungsten (W).

An insulating interlayer 160 overlapping the gate electrodes 152 and 155 is disposed on the gate insulating layer 140. The insulating interlayer 160, similar to the gate insulating layer 140, may include or be formed of silicon nitride (SiNx), silicon oxide (SiOx), tetraethoxysilane (TEOS), or the like, but example embodiments are not limited thereto.

A data wiring including source electrodes 173 and 176 and drain electrodes 174 and 177 is disposed on the insulating interlayer 160. The data wiring further includes the data line 171, the common power line 172, a second capacitor plate 178, and other wirings. In addition, the source electrodes 173 and 176 and the drain electrodes 174 and 177 are connected to the source area 136 and the drain area 137 of the semiconductor layers 131 and 132, respectively, through a contact hole defined at the gate insulating layer 140 and a contact hole defined at the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. Configurations of the TFTs 10 and 20 are not limited to the above example embodiments, and thus may be modified into various other suitable structures by those skilled in the pertinent art.

The capacitor 80 includes the first capacitor plate 158 and the second capacitor plate 178, having the insulating interlayer 160 interposed therebetween.

The switching TFT 10 may function as a switching element to select pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving TFT 20 applies, to the pixel electrode 211, a driving power which allows the light emitting layer 212 of the display layer 210 provided in the selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the display layer 210 through a contact hole.

With the aforementioned structure, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the display layer 210 through the driving TFT 20, such that the display layer 210 may emit light.

A planarization layer 165 covers the data wiring, e.g., the data line 171, the common power line 172, the source electrodes 173 and 176, the drain electrodes 174 and 177, and the second capacitor plate 178, which are patterned using a single mask. The planarization layer 165 is disposed on the insulating interlayer 160.

The planarization layer 165 provides a planar surface so as to increase luminous efficiency of the light emitting element disposed thereon. The planarization layer 165 may include one or more materials of the followings: a polyacrylate resin, an epoxy resin, a phenolic resin, a polyamide resin, a polyimide resin, an unsaturated polyester resin, a polyphenylen ether resin, a polyphenylene sulfide resin, and benzocyclobutene (BCB).

The pixel electrode 211 of the display portion 210 is disposed on the planarization layer 165. The pixel electrode 211 is connected to the drain electrode 177 through a contact hole defined at the planarization layer 165.

A portion of or the entirety of the pixel electrode 211 is disposed at a transmissive area (or light emitting area) of the pixel PX. That is, the pixel electrode 211 is disposed corresponding to the transmissive area of the pixel which is defined by a pixel defining layer 190. The pixel defining layer 190 may include a resin such as a polyacrylate resin and a polyimide resin.

The display layer 212 is disposed on the pixel electrode 211 in the transmissive area, and the common electrode 213 is disposed on the pixel defining layer 190 and the display layer 212.

The display layer 212 includes a low molecular organic material or a polymer organic material. At least one of a hole injection layer HIL and a hole transport layer HTL may further be disposed between the pixel electrode 211 and the display layer 212, and at least one of an electron transport layer ETL and an electron injection layer EIL may further be disposed between the light emitting layer 212 and the common electrode 213.

The pixel electrode 211 and the common electrode 213 may be formed as one of a transmissive electrode, a transflective electrode and a reflective electrode.

A transparent conductive oxide ("TCO") may be used to form a transmissive electrode. Such TCO may include at least one selected from the group consisting of: indium tin oxide (ITO), indium zinc oxide (IZO), antimony tin oxide (ATO), aluminum zinc oxide (AZO), zinc oxide (ZnO), and mixtures thereof.

A metal, e.g., magnesium (Mg), silver (Ag), gold (Au), calcium (Ca), lithium (Li), chromium (Cr), aluminum (Al), copper (Cu), or an alloy thereof may be used to form a transflective electrode and a reflective electrode. In some example embodiments, whether an electrode is a transflective electrode or a reflective electrode depends on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The pixel PX may have a double-sided emission type structure capable of emitting light in a direction of the pixel electrode 211 and a direction of the common electrode 213. In some example embodiments, both of the pixel electrode 211 and the common electrode 213 may be formed as a transmissive or transflective electrode.

The sealing member 250 is located on the common electrode 213. The sealing member 250 may include a transparent insulating substrate 111 which includes a glass, a transparent plastic, or the like. In addition, the sealing member 250 may have a thin film encapsulation structure including one or more inorganic layers and one or more organic layers. In some example embodiments, one or more inorganic layers and one or more organic layers are alternately stacked.

Figure 5:
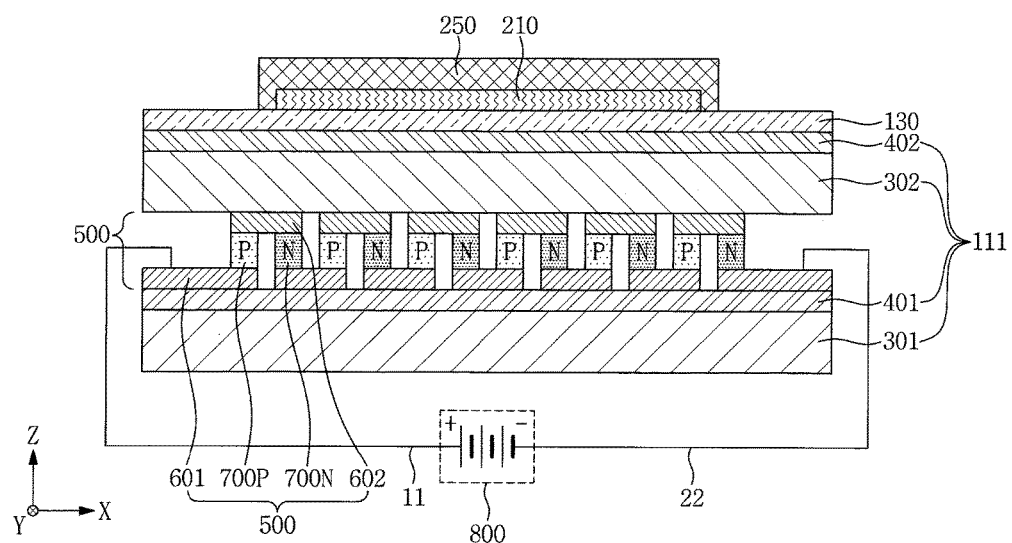
FIG. 5 is a view illustrating a connection relationship between the display device and a direct current ("DC") power source according to some example embodiments.

FIG. 5 is a view illustrating a connection relationship between the display device and the DC power source 800 according to some example embodiments;

As illustrated in FIG. 5, when a lower electrode 601 (hereinafter, "a first outermost lower electrode) located at a left edge of the substrate 111 and the second base layer 302 are spaced apart from each other by a predetermined distance in the Z-axis direction, the first terminal 11 of the DC power source 800 may be directly connected to the first outermost lower electrode. In other words, when the first outermost lower electrode does not contact the second base layer 302, the first terminal 11 of the DC power source 800 may be directly connected to the first outermost lower electrode 601. For example, when facing surfaces of the first outermost lower electrode and the second base layer 302 do not contact each other, the first terminal 11 may be directly connected to the first outermost lower electrode. In some example embodiments, the facing surfaces of the first outermost lower electrode 601 and the second base layer 302 refer to surfaces facing each other in the Z-axis direction.

Similarly, when a lower electrode 601 (hereinafter, "a second outermost lower electrode") located at a right edge of the substrate 111 and the second base layer 302 are spaced apart from each other by a predetermined distance in the Z-axis direction, the second terminal 22 of the DC power source 800 may be directly connected to the second outermost lower electrode. In other words, when the second outermost lower electrode does not contact the second base layer 302, the second terminal 22 of the DC power source 800 may be directly connected to the second outermost lower electrode. For example, when facing surfaces of the second outermost lower electrode and the second base layer 302 do not contact each other, the second terminal 22 may be directly connected to the second outermost lower electrode. In some example embodiments, the facing surfaces of the second outermost lower electrode 602 and the second base layer 302 refer to surfaces facing each other in the Z-axis direction.

Figure 6:
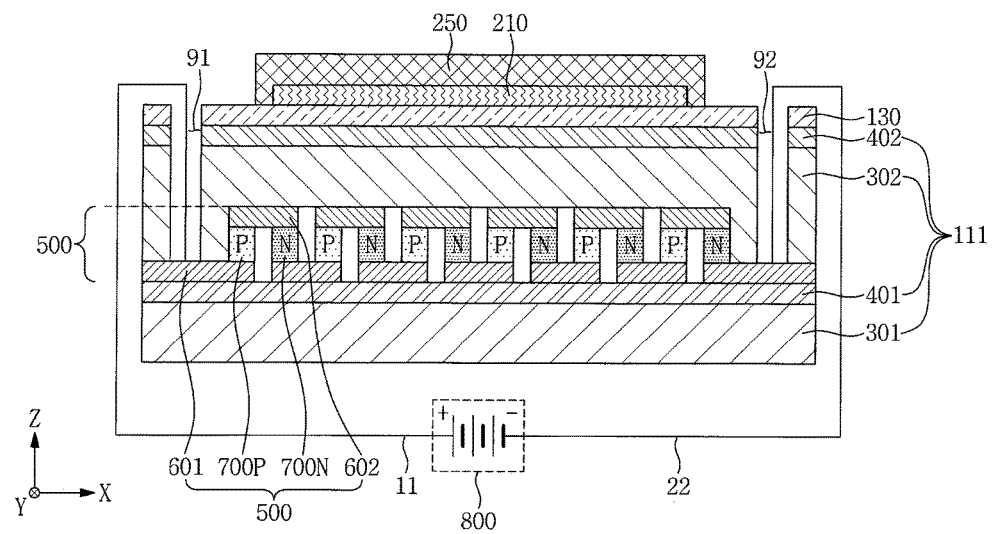
FIG. 6 is a view illustrating a connection relationship between the display device and a DC power source according to some example embodiments.

FIG. 6 is a view illustrating a connection relationship between the display device and a DC power source according to some example embodiments.

As illustrated in FIG. 6, when a lower electrode 601 (hereinafter, "a first outermost lower electrode") located at a left edge of a substrate 111 contacts a second base layer 302, a first terminal 11 of a DC power source 800 may be connected to a first outermost lower electrode through a first contact hole 91. For example, when facing surfaces of the first outermost lower electrode and the second base layer 302 contact each other, the first terminal 11 may be connected to the first outermost lower electrode through the first contact hole 91. In some example embodiments, facing surfaces of the first outermost lower electrode and the second base layer 302 refer to surfaces facing each other in the Z-axis direction.

The first contact hole 91 passes through the second base layer 302, a buffer layer, a gate insulating layer, an insulating interlayer, and a planarization layer corresponding to the first outermost lower electrode 601.

Similarly, when a lower electrode 601 (hereinafter, "a second outermost lower electrode") located at another edge of the substrate 111 contacts the second base layer 302, a second terminal of the DC power source 800 may be connected to the second outermost lower electrode 601 through a second contact hole. For example, when facing surfaces of the second outermost lower electrode 601 and the second base layer 302 contact each other, the second terminal may be connected to the second outermost lower electrode 601 through the second contact hole. In some example embodiments, the facing surfaces of the second outermost lower electrode 601 and the second base layer 302 refer to surfaces facing each other in the Z-axis direction.

The second contact hole passes through the second base layer 302, the buffer layer, the gate insulating layer, the insulating interlayer, and the planarization layer corresponding to the second outermost lower electrode 601.

FIGS. 7A, 7B, 7C, 7D, 7E, 7F, 7G, 7H, and 7I are cross-sectional views illustrating a process of manufacturing the display device according to some example embodiments.

Figure 7A:
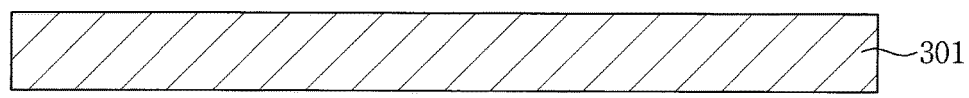
FIGS. 7A, 7B, 7C, 7D, 7E, 7F, 7G, 7H, and 7I are cross-sectional views illustrating a process of manufacturing the display device according to some example embodiments.

First, as illustrated in FIG. 7A, the first base layer 301 is prepared.

Figure 7B:

Thereafter, as illustrated in FIG. 7B, the first protective layer 401 is formed on the first base layer 301. The first protective layer 401 may be formed over an entire surface of the first base layer 301.

Then, although not illustrated, a first metal layer is formed over an entire surface of the first protective layer 401. The first metal layer may be deposited on the first protective layer 401 by a physical vapor deposition (PVD) method such as sputtering.

Figure 7C:
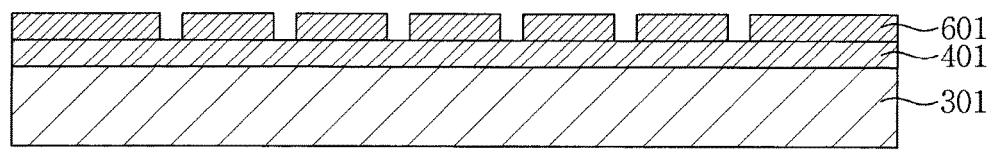

Subsequently, the aforementioned first metal layer is patterned by a photolithography process, and the plurality of lower electrodes 601 are formed on the first protective layer 401, as illustrated in FIG. 7C. During the photolithography process, the first metal layer may be removed by a wet-etching process using an etching solution.

Next, although not illustrated, a semiconductor material is formed over an entire surface of the first base layer 301 including the lower electrodes 601. This semiconductor material is formed over an entire surface of the lower electrodes 601. In some example embodiments, the semiconductor material is not formed between adjacent ones of the lower electrodes 601. This is because an interval between adjacent ones of the lower electrodes 601 is considerably small. The semiconductor material may be deposited on the lower electrodes 601 by chemical vapor deposition (CVD) method.

Figure 7D:
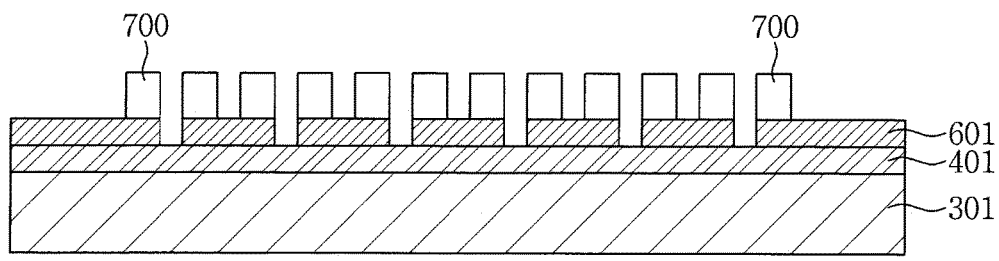

Thereafter, the semiconductor material is patterned by a photolithography process, and thus a plurality of semiconductor patterns 700 are formed on the lower electrodes 601, as illustrated in FIG. 7D.

Figure 7E:
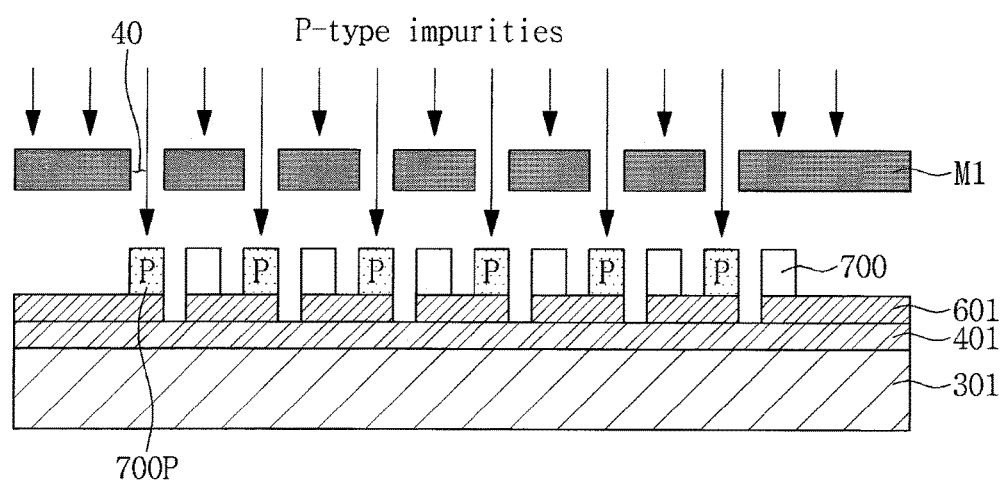

Next, as illustrated in FIG. 7E, a first mask M1 is placed on the plurality of semiconductor patterns 700. The first mask M1 includes a plurality of openings 40. The openings 40 are located corresponding to some of the plurality of semiconductor patterns 700. For example, the openings 40 of the first mask M1 may be located corresponding to odd-numbered semiconductor patterns 700.

P-type impurities (or P-type impurity ions) are implanted into the semiconductor patterns 700 through the first mask M1. In some example embodiments, the P-type impurity ions are selectively implanted into the semiconductor patterns 700 located corresponding to the openings 40 of the first mask M1. For example, the P-type impurities may be selectively implanted into the odd-numbered semiconductor patterns of the plurality of semiconductor patterns 700. The semiconductor pattern 700 into which the P-type impurities are implanted corresponds to the P-type thermoelectric semiconductor element 700P.

Figure 7F:
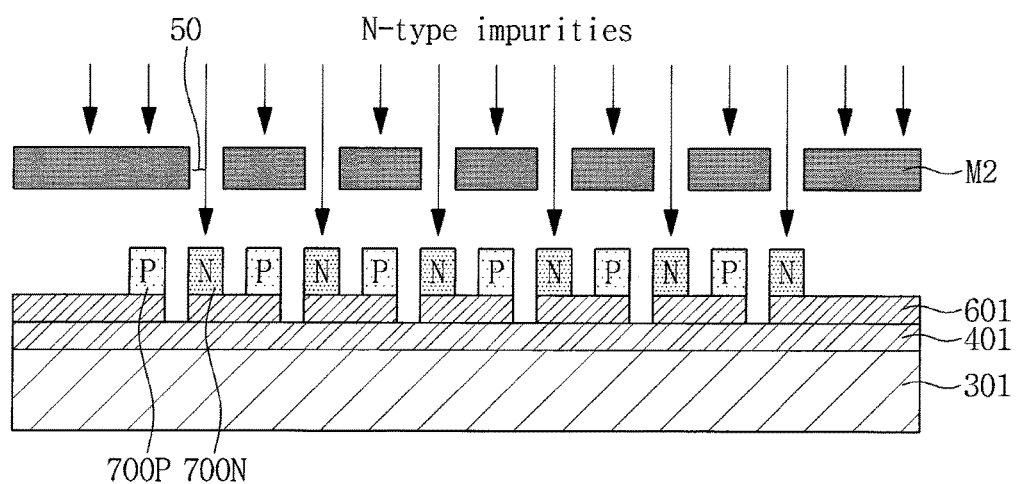

Thereafter, as illustrated in FIG. 7F, a second mask M2 is placed on the plurality of semiconductor patterns 700. The second mask M2 includes a plurality of openings 50. The openings 50 are located corresponding to some of the plurality of semiconductor patterns 700. For example, the openings 50 of the second mask M2 may be located corresponding to even-numbered semiconductor patterns 700.

N-type impurities (or N-type impurity ions) are implanted into the semiconductor patterns 700 through the second mask M2. In some example embodiments, the N-type impurity ions are selectively implanted into the semiconductor patterns 700 located corresponding to the openings 50 of the second mask M2. For example, the N-type impurities may be selectively implanted into the even-numbered semiconductor patterns 700 of the plurality of semiconductor patterns 700. The semiconductor pattern 700 into which the N-type impurities are implanted corresponds to the N-type thermoelectric semiconductor element 700N.

Next, a second metal layer may be formed over an entire surface of the first base layer 301 including the P-type thermoelectric semiconductor elements 700P and the N-type thermoelectric semiconductor elements 700N. The second metal layer may be deposited on the P-type thermoelectric semiconductor elements 700P, the N-type thermoelectric semiconductor elements 700N, and the lower electrodes 601 by a physical vapor deposition method such as sputtering. In some example embodiments, the second metal layer is not formed between the P-type thermoelectric semiconductor element 700P and the N-type thermoelectric semiconductor element 700N that are adjacent to each other. This is because an interval between the P-type thermoelectric semiconductor element 700P and the N-type thermoelectric semiconductor element 700N adjacent to each other is considerably small.

Figure 7G:
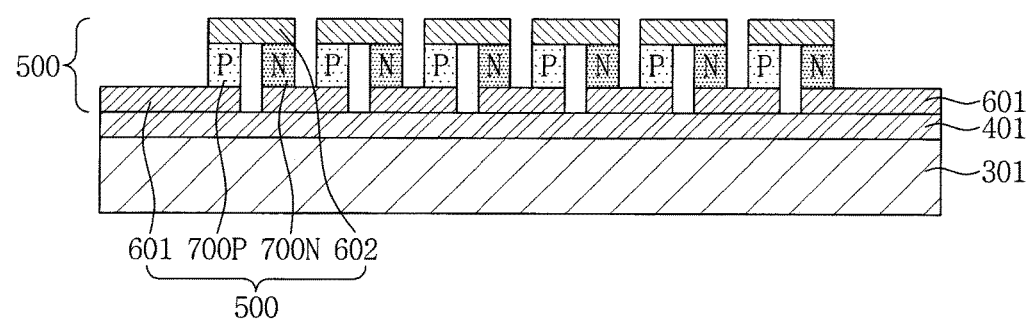

Next, as the aforementioned second metal layer is patterned through a photolithography process, the plurality of upper electrodes 602 are formed on the P-type thermoelectric semiconductor elements 700P and the N-type thermoelectric semiconductors 700P, as illustrated in FIG. 7G. During the photolithography process, the second metal layer may be removed by a wet-etching process using an etching solution. On the other hand, an etch rate of the second metal layer and an etch rate of the first metal layer may be different from each other.

Figure 7H:
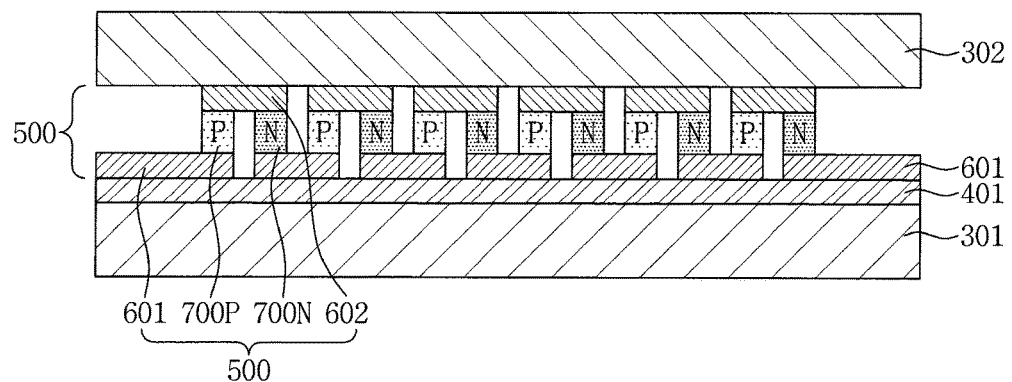

Next, as illustrated in FIG. 7H, the second base layer 302 is formed on the upper electrodes 602. On the other hand, the second base layer 302 is not formed between adjacent ones of the upper electrodes 602. This is because an interval between adjacent ones of the upper electrodes 602 is considerably small. However, as illustrated in FIG. 6, the second base layer 302 may be formed on the first outermost lower electrode and the second outermost lower electrode.

Figure 7I:
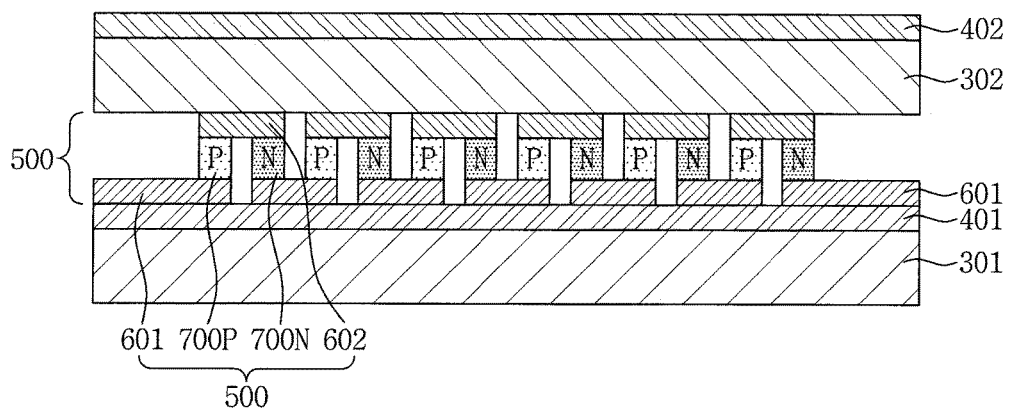

Thereafter, as illustrated in FIG. 7I, the second protective layer 402 is formed on the second base layer 302. The second protective layer 402 may be formed over an entire surface of the second base layer 302.

Next, although not illustrated, the driving circuit portion 130 is formed on the second protective layer 402, the display portion 210 is formed on the driving circuit portion 130, and the sealing member 250 surrounding the display portion 210 is formed.

Figure 8:
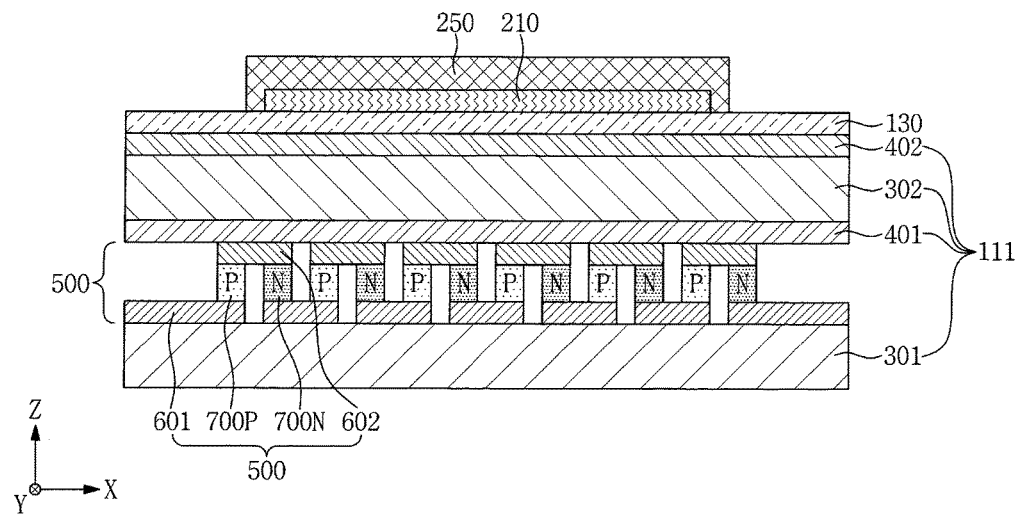
FIG. 8 is a cross-sectional view illustrating a display device according to some example embodiments.

FIG. 8 is a cross-sectional view illustrating a display device according to some example embodiments. As illustrated in FIG. 8, the display device according to some example embodiments includes a substrate 111, a thermoelectric element 500, a driving circuit portion 130, a display portion 210, and a sealing member 250.

As described above, the thermoelectric element 500 may be located between two layers included in the substrate 111, and the thermoelectric element 500 may be located between a first base layer 301 and a first protective layer 401, as illustrated in FIG. 8. In some example embodiments, a lower electrode 601 of the thermoelectric element 500 contacts the first base layer 301, and an upper electrode 602 of the thermoelectric element 500 contacts the first protective layer 401.

In some example embodiments, the thermoelectric element 500 further includes a lower base layer and an upper base layer. In the structure illustrated in FIG. 8, the first base layer 301 may serve as a lower base layer of the thermoelectric element 500, and the first protective layer 401 may serve as an upper base layer of the thermoelectric element 500.

The specific configuration of the substrate 111, the thermoelectric element 500, the driving circuit portion 130, the display portion 210, and the sealing member 250 of FIG. 8 will make reference to the descriptions described above with reference to FIGS. 1 to 7I.

Figure 9:
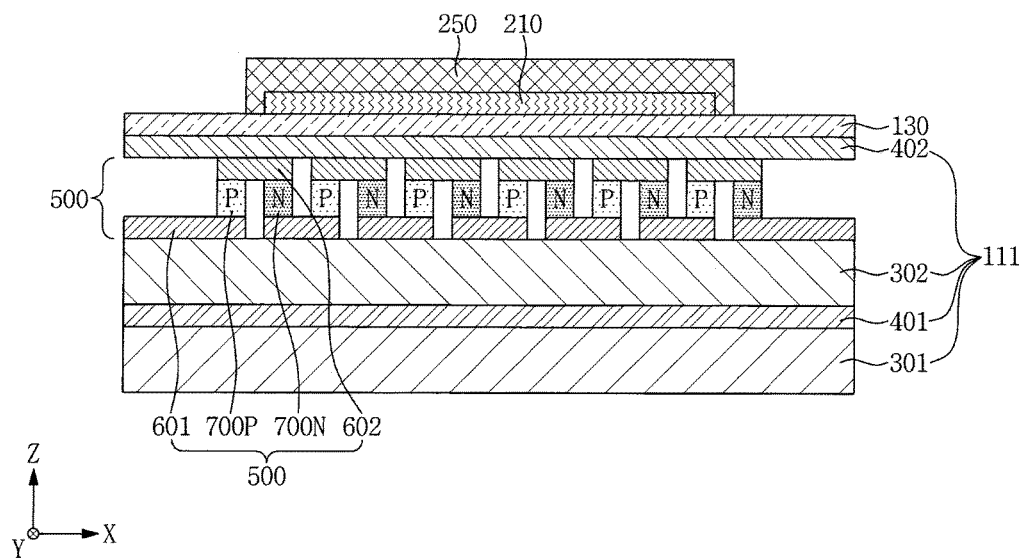
FIG. 9 is a cross-sectional view illustrating a display device according to some example embodiments.

FIG. 9 is a cross-sectional view illustrating a display device according to some example embodiments.

As illustrated in FIG. 9, the display device according to some example embodiments includes a substrate 111, a thermoelectric element 500, a driving circuit portion 130, a display portion 210, and a sealing member 250.

As described above, the thermoelectric element 500 may be located between two layers included in the substrate 111, and the thermoelectric element 500 may be located between a second base layer 302 and a second protective layer 402, as illustrated in FIG. 9. In some example embodiments, a lower electrode 601 of the thermoelectric element 500 contacts the second base layer 302, and an upper electrode 602 of the thermoelectric element 500 contacts the second protective layer 402.

In some example embodiments, the thermoelectric element 500 further includes a lower base layer and an upper base layer. In the configuration illustrated in FIG. 9, the second base layer 302 may serve as a lower base layer of the thermoelectric element 500, and the second protective layer 402 may serve as an upper base layer of the thermoelectric element 500.

The detailed configuration of the substrate 111, the thermoelectric element 500, the driving circuit portion 130, the display portion 210, and the sealing member 250 of FIG. 9 will make reference to the descriptions described above with reference to FIGS. 1 to 7I.

Figure 10:
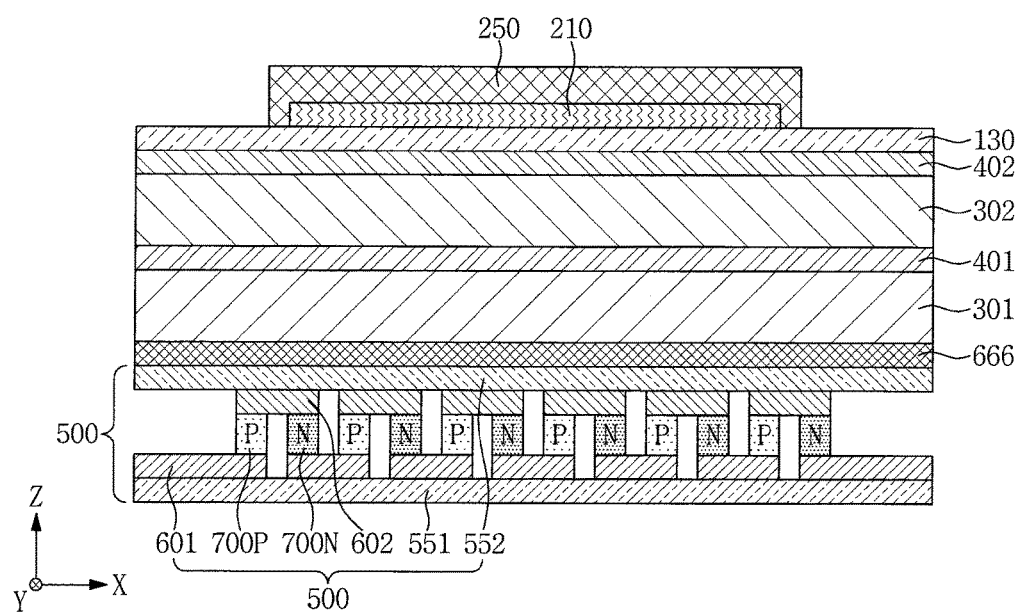
FIG. 10 is a cross-sectional view illustrating a display device according to some example embodiments.

FIG. 10 is a cross-sectional view illustrating a display device according to some example embodiments.

As illustrated in FIG. 10, the display device according to some example embodiments includes a substrate 111, an adhesive 666, a thermoelectric element 500, a driving circuit portion 130, a display portion 210, and a sealing member 250.

The driving circuit portion 130 is located on the substrate 111. The driving circuit portion 130 may include at least one switching element. The driving circuit portion 130 drives the display portion 210.

The display portion 210 is located on the driving circuit portion 130. The display portion 210 may include a pixel electrode 211, a display layer 212, and a common electrode 213. The display layer 212 is located between the pixel electrode 211 and the common electrode 213.

The sealing member 250 is located on the display portion 210. In some example embodiments, the sealing member 250 surrounds the display portion 210.

The substrate 111 includes at least two layers arranged along the Z-axis direction. For example, the at least two layers may include a first base layer 301, a first protective layer 401, a second base layer 302, and a second protective layer 402. The first base layer 301, the first protective layer 401, the second base layer 302, and the second protective layer 402 are arranged along the Z-axis direction.

The first protective layer 401 is located on the first base layer 301, the second base layer 302 is located on the first protective layer 401, and the second protective layer 402 is located on the second base layer 302. In other words, the first protective layer 401 is located between the first base layer 301 and the second base layer 302, and the second base layer 302 is located between the first protective layer 401 and the second protective layer 402.

The thermoelectric element 500 is attached to the substrate 111 using the adhesive 666. To this end, the adhesive 666 is located between the substrate 111 and the thermoelectric element 500. For example, the thermoelectric element 500 is attached to the first base layer 301 located at an outermost portion of the substrate 111, and the aforementioned adhesive 666 may be located between the first base layer 301 and the thermoelectric element 500. The adhesive 666 may include a pressure sensitive adhesive (PSA) or an optical clear adhesive (OCA). The thermoelectric element 500 may include a Peltier element.

As illustrated in FIG. 8, the thermoelectric element 500 includes a lower electrode 601, an upper electrode 602, an N-type thermoelectric semiconductor element 700N, a P-type thermoelectric semiconductor element 700P, a lower base layer 551, and an upper base layer 552.

The lower electrode 601 and the upper electrode 602 are located between the lower base layer 551 and the upper base layer 552. In some example embodiments, the lower electrode 601 is located closer to the lower base layer 551 of the lower base layer 551 and the upper base layer 552, and the upper electrode 602 is located closer to the upper base layer 552 of the lower base layer 551 and the upper base layer 552. The lower electrode 601 of the lower electrode 601 and the upper electrode 602 is located closer to the lower base layer 551, and the upper electrode 602 of the lower electrode 601 and the upper electrode 602 is located closer to the upper base layer 552.

The lower electrode 601 may contact the lower base layer 551, and the upper electrode 602 may contact the upper base layer 552.

The lower electrode 601, the upper electrode 602, the P-type thermoelectric semiconductor element 700P, and the N-type thermoelectric semiconductor element 700N of FIG. 10 are substantially identical to the lower electrode 601, the upper electrode 602, the P-type thermoelectric semiconductor element 700P, and the N-type thermoelectric semiconductor element 700N of FIG. 1, respectively.

When a voltage based on a DC power source 800 is applied to the thermoelectric element 500, the thermoelectric element 500 absorbs a heat generated from the display portion 210 and emits it to the outside. For example, the thermoelectric element 500 absorbs the heat generated from the display layer 212 of the display portion 210 through the driving circuit portion 130, the second protective layer 402, the second base layer 302, the first protective layer 401, the first base layer 301, and the adhesive 666, and releases the absorbed heat to the outside. That is, the thermoelectric element may efficiently radiate the heat of the display portion 210 to the outside through active heat absorption and radiation operation.

Alternatively, the thermoelectric element according to some example embodiments may be applied to various display devices including an LCD device. For example, the display device according to some example embodiments may include liquid crystals in place of the above-described light emitting element as the display layer 212. In some example embodiments, the aforementioned sealing member 250 may be an opposing substrate.

As set forth hereinabove, the display device according to some example embodiments may provide the following effects.

The display device includes a thermoelectric element capable of actively emitting internal heat. Accordingly, the heat from a display layer, in particular, from a light emitting element, may be released to the outside more easily.

In some example embodiments, the thermoelectric element may be located between a plurality of layers included in a substrate. In this case, because the layer serves as a base layer of the thermoelectric element, a base layer of the thermoelectric element may be omitted. Accordingly, the thickness of the display device may not excessively increase even though the thermoelectric element is attached to the display device.

While the present invention has been illustrated, and described with reference to some example embodiments thereof, it will be apparent to those of ordinary skill in the art that various changes in form, and detail may be formed thereto without departing from the spirit, and scope of the present invention, as defined in the following claims, and their equivalents.

What is claimed is:

1. A display device comprising:
a substrate comprising at least two layers;
a driving circuit on the substrate;
a pixel electrode connected to the driving circuit;
a common electrode on the pixel electrode;
a display layer between the pixel electrode and the common electrode;
a direct current (DC) power source; and
a thermoelectric element between the at least two layers of the substrate,
wherein the thermoelectric element comprises:
a plurality of lower electrodes between the two layers;
wherein a first terminal of the direct current (DC) power source is connected to one of the plurality of lower electrodes through a first contact hole passing through the driving circuit and the substrate, and a second terminal of the direct current (DC) power source is connected to another of the plurality of lower electrodes through a second contact hole passing through the driving circuit and the substrate.

2. The display device of claim 1, wherein the at least two layers comprise a first base layer and a second base layer facing each other with the thermoelectric element interposed therebetween.

3. The display device of claim 2, wherein the at least two layers further comprise a first protective layer between the first base layer and the thermoelectric element.

4. The display device of claim 3, wherein the at least two layers further comprise a second protective layer between the second base layer and the driving circuit.

5. The display device of claim 1, wherein the thermoelectric element comprises a Peltier element.

6. The display device of claim 1, wherein the thermoelectric element comprises:
the plurality of lower electrodes between the two layers and contacting a first one of the two layers;
an upper electrode between the two layers and contacting a second one of the two layers; and
a P-type thermoelectric semiconductor element and an N-type thermoelectric semiconductor element between the plurality of lower electrodes and the upper electrode.

7. The display device of claim 6, wherein the plurality of lower electrodes are separated from each other.

8. The display device of claim 7, wherein the DC power source is connected to the one of the plurality of lower electrodes and the another of the plurality of lower electrodes.

9. The display device of claim 8, wherein the first terminal of the direct current (DC) power source is directly connected to the one of the lower electrodes, and the second terminal of the direct current (DC) power source is directly connected to the another of the lower electrodes.

10. The display device of claim 1, wherein the display layer comprises a light emitting element or a liquid crystal.

11. The display device of claim 1, further comprising a sealing member or an opposing substrate on the common electrode.

12. A display device comprising:
a substrate;
a driving circuit on the substrate;
a pixel electrode connected to the driving circuit;
a common electrode on the pixel electrode;
a display layer between the pixel electrode and the common electrode;
a direct current (DC) power source; and
a thermoelectric element facing the driving circuit with the substrate interposed therebetween,
wherein the thermoelectric element comprises:
a plurality of lower electrodes;
wherein a first terminal of the direct current (DC) power source is connected to one of the lower electrodes through a first contact hole passing through the driving circuit and the substrate, and a second terminal of the direct current (DC) power source is connected to another of the lower electrodes through a second contact hole passing through the driving circuit and the substrate.

13. The display device of claim 12, further comprising an adhesive layer between the substrate and the thermoelectric element.

14. The display device of claim 13, wherein the adhesive layer comprises a pressure sensitive adhesive (PSA) or an optical clean adhesive (OCA).

15. The display device of claim 12, wherein the substrate comprises at least two layers.

16. The display device of claim 15, wherein the at least two layers comprise:
- a first base layer; and
- a second base layer on the first base layer.

17. The display device of claim 16, wherein the at least two layers further comprise a first protective layer between the first base layer and the second base layer.

18. The display device of claim 17, wherein the at least two layers further comprise a second protective layer between the second base layer and the driving circuit.

19. The display device of claim 12, wherein the thermoelectric element comprises a Peltier element.

20. The display device of claim 12, wherein the thermoelectric element comprises:
- a lower base layer;
- an upper base layer between the lower base layer and the substrate;
- the plurality of lower electrodes between the lower base layer and the upper base layer and contacting the lower base layer;
- an upper electrode between the lower base layer and the upper base layer and contacting the upper base layer; and
- a P-type thermoelectric semiconductor element and an N-type thermoelectric semiconductor element between the plurality of lower electrodes and the upper electrode.

* * * * *